(12) United States Patent
Song et al.

(10) Patent No.: US 9,478,771 B2
(45) Date of Patent: Oct. 25, 2016

(54) ORGANIC LIGHT-EMITTING DISPLAY DEVICE AND METHOD OF MANUFACTURING THE SAME

(71) Applicant: Samsung Display Co., Ltd., Yongin, Gyeonggi-Do (KR)

(72) Inventors: Ji-Hoon Song, Yongin (KR); Kyu-Sik Cho, Yongin (KR); Sun Park, Yongin (KR); Yul-Kyu Lee, Yongin (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 43 days.

(21) Appl. No.: 13/796,811

(22) Filed: Mar. 12, 2013

(65) Prior Publication Data

US 2014/0131666 A1 May 15, 2014

(30) Foreign Application Priority Data

Nov. 13, 2012 (KR) .................. 10-2012-0128375

(51) Int. Cl.
*H01L 51/52* (2006.01)
*H01L 27/32* (2006.01)

(52) U.S. Cl.
CPC ....... *H01L 51/5275* (2013.01); *H01L 27/3248* (2013.01); *H01L 27/3265* (2013.01); *H01L 2227/323* (2013.01)

(58) Field of Classification Search
CPC ........... H01L 51/5271; H01L 51/5273; H01L 51/5275

USPC ...................................................... 257/40, 72
See application file for complete search history.

(56) References Cited

U.S. PATENT DOCUMENTS

| | | | |
|---|---|---|---|
| 2005/0121677 A1* | 6/2005 | Kim et al. | 257/72 |
| 2006/0147650 A1* | 7/2006 | Park | 428/1.1 |
| 2006/0284554 A1* | 12/2006 | Yotsuya | 313/506 |
| 2011/0297943 A1* | 12/2011 | Kim et al. | 257/59 |
| 2012/0205676 A1* | 8/2012 | Seo et al. | 257/88 |

FOREIGN PATENT DOCUMENTS

| | | |
|---|---|---|
| JP | 2003-124373 | 4/2003 |
| JP | 2005174914 A * | 6/2005 |
| KR | 1020050087069 A | 8/2005 |
| KR | 1020060000842 A | 1/2006 |
| KR | 1020070038789 A | 4/2007 |

OTHER PUBLICATIONS

English Machine Translation of JP 2005-174914 A by AIPN.*

* cited by examiner

*Primary Examiner* — Allen Parker
*Assistant Examiner* — Stephen Bradley
(74) *Attorney, Agent, or Firm* — Robert E. Bushnell, Esq.

(57) ABSTRACT

An organic light-emitting display (OLED) device is provided. The OLED device includes: a substrate of which a pixel region is defined; a light-condensing means disposed on the pixel region of the substrate; a lower electrode disposed on the light-condensing means; an organic layer, which is disposed on the lower electrode and includes an organic light-emitting layer; and an upper electrode disposed on the organic layer. A method for manufacturing such an OLED device is also provided.

14 Claims, 10 Drawing Sheets

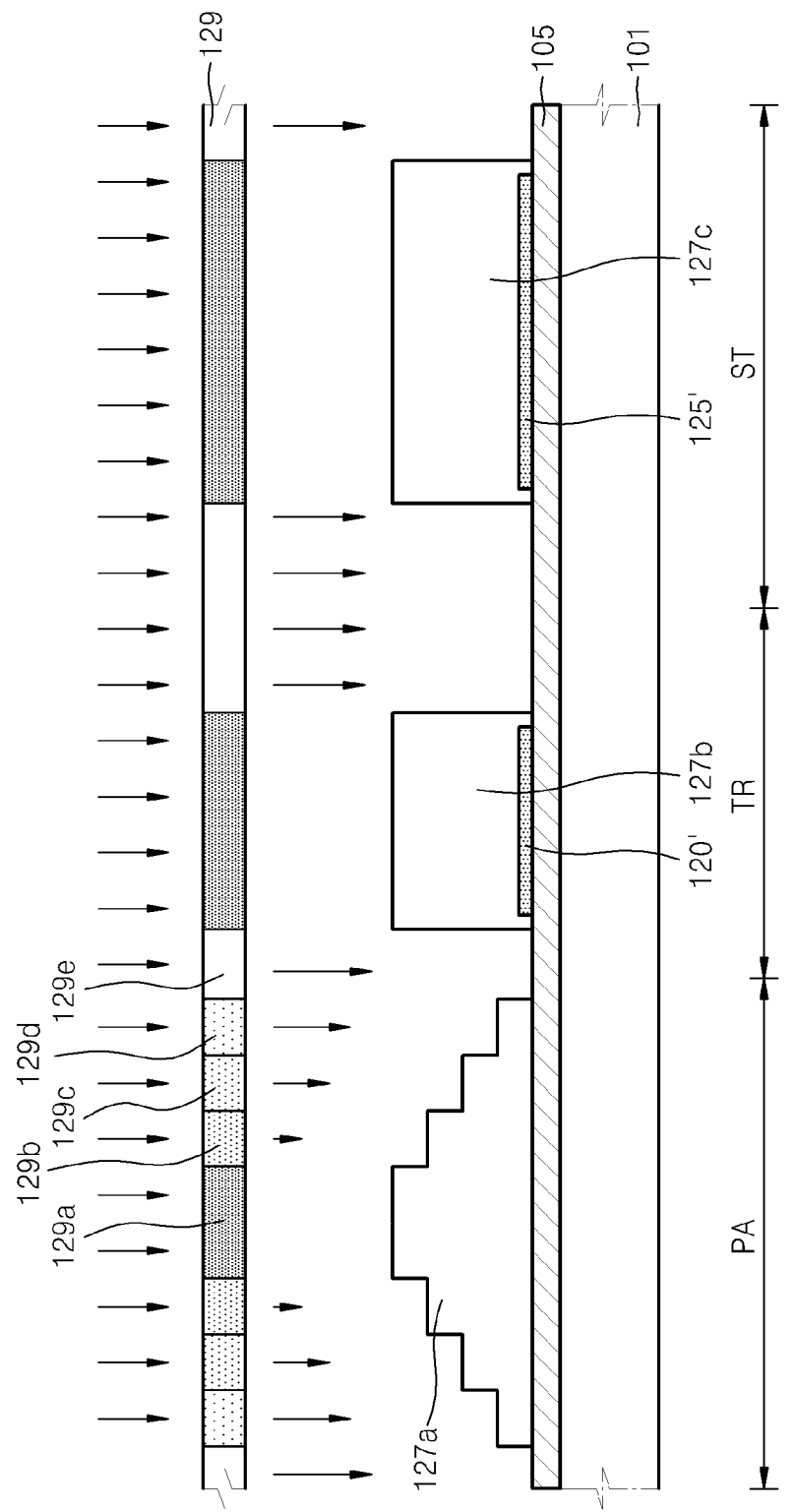

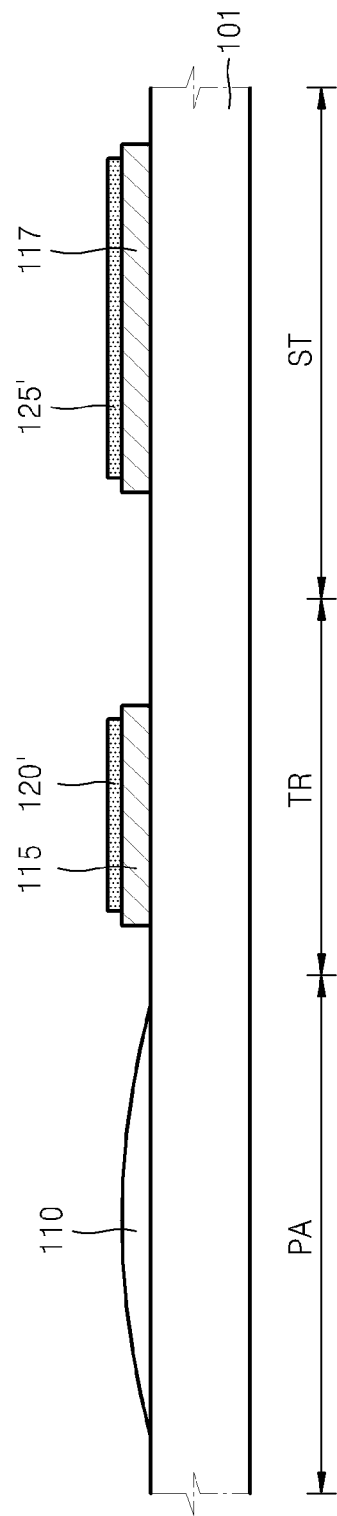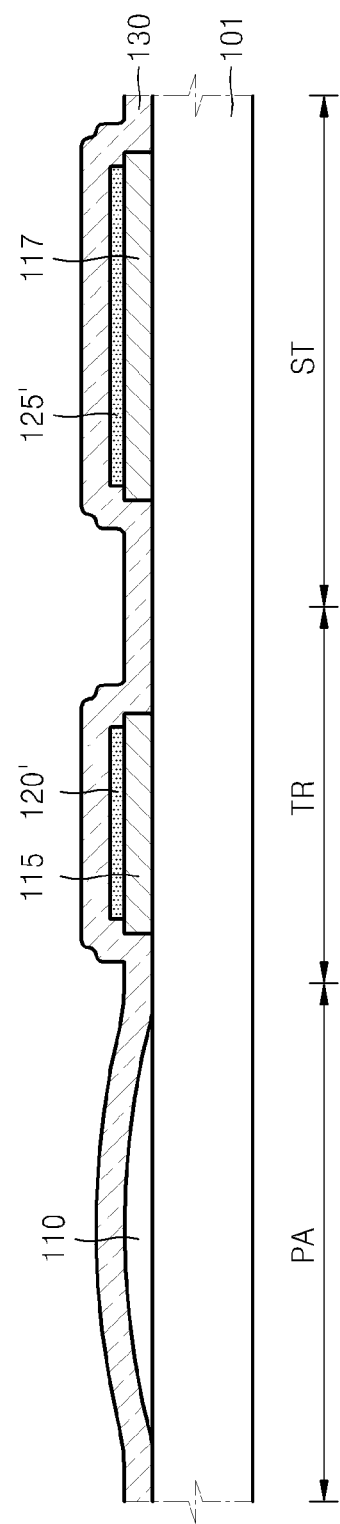

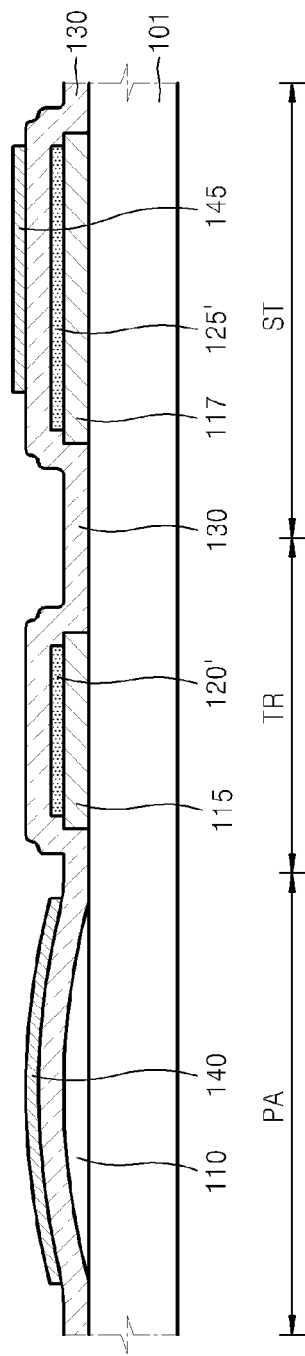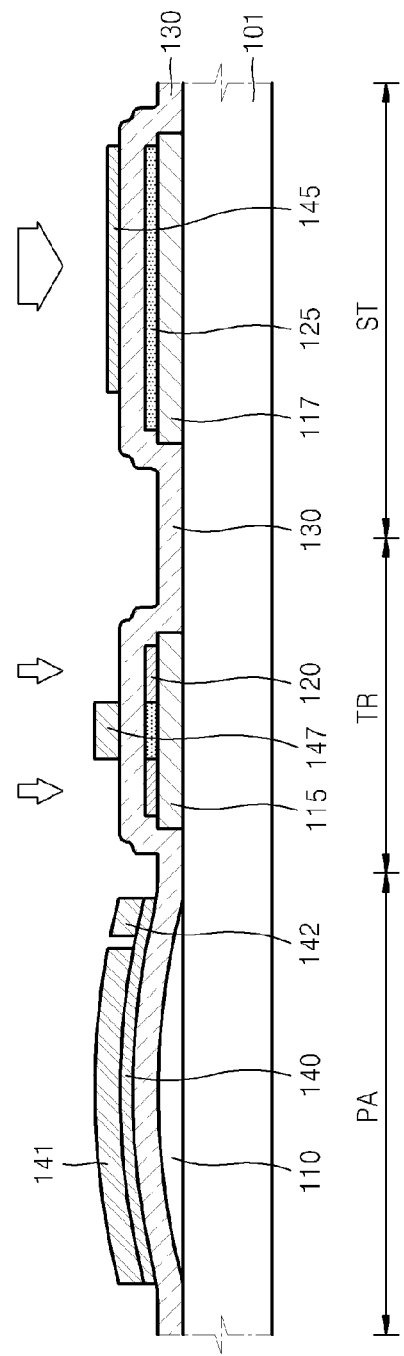

ORGANIC LIGHT-EMITTING DISPLAY DEVICE AND METHOD OF MANUFACTURING THE SAME

CLAIM OF PRIORITY

This application makes reference to, incorporates the same herein, and claims all benefits accruing under 35 U.S.C. §119 from an application for ORGANIC LIGHT-EMITTING DISPLAY DEVICE AND METHOD OF MANUFACTURING THE SAME, earlier filed in the Korean Intellectual Property Office on 13 Nov. 2012 and there duly assigned Serial No. 10-2012-0128375.

BACKGROUND OF THE INVENTION

1. Field of the Invention

The present invention relates to a display device, and more particularly, to an enhanced organic light-emitting display (OLED) device in which extraction efficiency of light emitted by an organic light-emitting layer is improved, and a method of manufacturing the same.

2. Description of the Related Art

Among flat surface display devices, an organic light-emitting display (OLED) device is a self-light-emitting-type display device and has the advantages of a wide view angle, excellent contrast, and a quick response speed. The OLED device includes an anode electrode on a substrate, an organic light-emitting layer on the anode electrode, and a cathode electrode on the organic light-emitting layer. When a voltage is applied between the anode electrode and the cathode electrode, the organic light-emitting layer emits light. The light emitted by the organic light-emitting layer is extracted to the outside through the anode electrode and/or the cathode electrode.

A portion of the light, having passed through the anode electrode, may not be extracted to the outside because it is instead dispersed in left and right directions along the plane of the substrate. As a result, the light extraction efficiency of the OLED device may be lowered.

SUMMARY OF THE INVENTION

The present invention provides an organic light-emitting display (OLED) device that is improved to increase light extraction efficiency, which is understood to mean the portion of light generated by an organic light-emitting layer that is extracted to the outside.

The present invention also provides a method of manufacturing an OLED device having improved light extraction efficiency.

According to an aspect of the present invention, there is provided an OLED device including: a substrate on which a pixel region is defined; a light-condensing means formed directly on the pixel region of the substrate; a lower electrode disposed on the light-condensing means; an organic layer which is disposed on the lower electrode and includes an organic light-emitting layer; and an upper electrode disposed on the organic layer.

The OLED device may further include a gate insulation film interposed between the light-condensing means and the lower electrode.

The substrate may include a circuit region distinguished from the pixel region. The OLED device may further include: an active layer which is disposed in the circuit region of the substrate and includes a channel region; and a gate electrode disposed in the channel region of the active layer.

The gate insulation film may be interposed between the active layer and the gate insulation film in the circuit region.

The OLED device may further include a first buffer film pattern, which is interposed between the substrate and the active layer and is disposed on the same plane with but is physically separated from the light-condensing means.

The substrate may include a storage region distinguished from the pixel region. The OLED device may further include: a first capacitor electrode disposed in the storage region; and a second capacitor electrode disposed on the first capacitor electrode. The gate insulation film may be interposed between the first capacitor electrode and the second capacitor electrode in the storage region.

The OLED device may further include a second buffer film pattern, which is interposed between the substrate and the first capacitor electrode and is disposed on the same plane with but is physically separated from the light-condensing means.

The OLED device may further include a third capacitor electrode disposed on the second capacitor electrode. The first capacitor electrode and the second capacitor electrode may form a first capacitor. The second capacitor electrode and the third capacitor electrode may form a second capacitor. The second capacitor electrode may be a common electrode of the first capacitor and the second capacitor.

The light-condensing means may be directly layered on the substrate.

The light-condensing means may have a cross-sectional shape of a convex lens of which a center part is thicker than an edge part. A refractive index of a material of the light-condensing means may be greater than that of the organic layer.

The light-condensing means may have a cross-sectional shape of a concave lens of which an edge part is thicker than a center part. A refractive index of a material of the light-condensing means may be less than that of the organic layer.

The light-condensing means may be formed using a half-tone mask.

Light emitted by the organic layer may be converged on a focal point by the light-condensing means.

According to another aspect of the present invention, there is provided a method of manufacturing an OLED device, including: forming a light-condensing means in a pixel region of a substrate; forming a lower electrode on the light-condensing means; forming an organic layer including an organic light-emitting layer on the lower electrode; and forming an upper electrode on the organic layer.

The forming of the light-condensing means may include forming a buffer film on the substrate. Thereafter, a semiconductor pattern may be formed on the buffer film that is in a circuit region of the substrate. Thereafter, a buffer film pattern under the semiconductor pattern may be formed in the circuit region, and the light-condensing means in the pixel region may be formed by patterning the buffer film using a half-tone mask. This buffer film patterning follows the semiconductor layer pattern formation because, as explained in more detail below, removing the last traces of semiconductor material from the buffer film layer during buffer film etching prevents the appearance of undesired dark spots in the OLED display.

The forming of the light-condensing means may include forming a buffer film on the substrate. Thereafter, a photoresist film may be formed on the buffer film. Thereafter, a stepped photoresist pattern may be formed by exposing and developing the photoresist film using a half-tone mask. Thereafter, the light-condensing means may be formed by using the stepped photoresist pattern as an etching mask to etch the buffer film and thereby remove excess buffer film material. In addition, when the buffer film is etched, the stepped photoresist pattern may be gradually removed together with the buffer film.

After forming the light-condensing means, a gate insulation film may be formed on the light-condensing means.

A center part of the light-condensing means may be formed thicker than an edge part thereof.

The center part of the light-condensing means may be formed thinner than the edge part thereof.

According to another aspect of the present invention, provided is a display device including: a light-emitting means disposed on a substantially planar substrate; and a light-condensing means disposed between the substrate and the light-emitting means. The light-condensing means may have a flat first surface directly contacting the substrate, and light emitted by the light-emitting means may be converged on a focal point by the light-condensing means.

The light-condensing means may have a concave second surface, which is located opposite to the first surface, and the light-emitting means may have a convex third surface corresponding to the concave second surface of the light-condensing means.

The light-condensing means may have a convex second surface, which is located opposite to the first surface, and the light-emitting means may have a concave third surface corresponding to the convex second surface of the light-condensing means.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein:

FIGS. 3 through 12 are cross-sectional views schematically illustrating a method of manufacturing an OLED device sequentially according to an embodiment of the present invention.

DETAILED DESCRIPTION OF THE INVENTION

Exemplary embodiments of the present invention will now be described in detail with reference to the accompanying drawings. The embodiments are provided to describe the present invention more fully to one of ordinary skill in the art. The embodiments may, however, be embodied in many different forms and should not be construed as being limited to the embodiments set forth herein; rather, these embodiments include every modified, equivalent, or replaced one within the spirit and technical scope of the present invention.

Reference numbers are used to refer to like elements throughout in the figures and the following description. In the figures, dimensions of structures may be magnified or reduced compared with actual scale drawings in order to promote a clearer understanding of the present invention.

The terminology used in the present specification is used only to describe specific embodiments and is not intended to limit the present invention. An expression in the singular includes an expression in the plural unless they are clearly different from each other in a particular context. In the specification, it should be understood that the terms, such as 'include' and 'have', are used to indicate the existence of implemented features without excluding in advance the possibility of existence or addition of one or more other features. In the specification, the term "and/or" includes any and all combinations of one or more of the associated listed features. In the specification, terms, such as 'first' and 'second', are merely used for an intention for classifying a certain feature from another feature to describe various features, and the features are not limited by the terms. In the description below, when it is disclosed that a first feature is connected to, combined with, or linked to a second feature, this does not exclude the possibility that a third feature may be interposed between the first feature and the second feature.

All terms used herein including technical or scientific terms have the same meaning as those generally understood by one of ordinary skill in the art unless they are defined differently. It should be understood that terms generally used, which are defined in a dictionary, have the same meaning as in a context of related technology, and the terms should not be understood in an ideal or excessively formal sense unless they are clearly defined in that way in the application.

As used herein, expressions such as "at least one of," when preceding a list of elements, modify the entire list of elements and do not modify the individual elements of the list.

Figure 1:
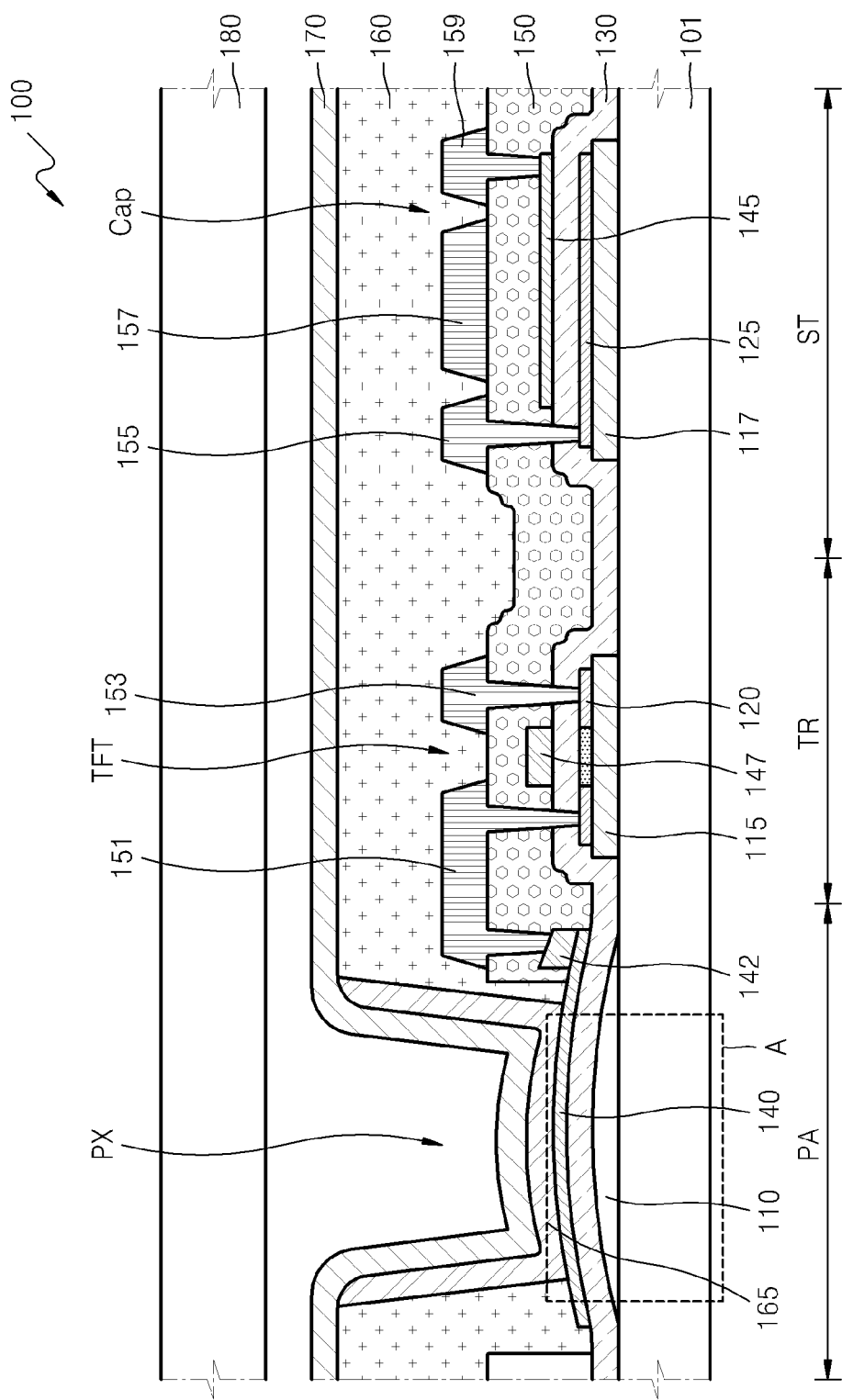
FIG. 1 is a cross-sectional view schematically illustrating an organic light-emitting display (OLED) device according to an embodiment of the present invention.

FIG. 1 is a cross-sectional view schematically illustrating an organic light-emitting display (OLED) device 100 according to an embodiment of the present invention.

Referring to FIG. 1, the OLED device 100 includes a substrate 101, a light-condensing means 110, a light-emitting pixel (PX) disposed on the light-condensing means 110, a thin film transistor (TFT) disposed on a first buffer film pattern 115, and a capacitor unit (Cap) disposed on a second buffer film pattern 117.

The substrate 101 may be defined by a plurality of regions and may include a pixel region (PA), a circuit region (TR), and a storage region (ST) as shown in FIG. 1.

The PA may include a lower electrode 140, an organic layer 165 on the lower electrode 140, and an upper electrode 170 on the organic layer 165. In addition, the PA may further include the light-condensing means 110 between the lower electrode 140 and the substrate 101. The organic layer 165 may emit light when a voltage is applied between the lower electrode 140 and the upper electrode 170.

The TR is a region for delivering various electrical signals for an operation of the PA, and TFT's may be disposed in the TR.

The TFT may include an active layer 120, a gate electrode 147, a source electrode 151, and a drain electrode 153. In addition, the source electrode 151 may be connected to the active layer 120 through a source region and a contact plug of the active layer 120. The drain electrode 153 may be connected to the active layer 120 through a drain region and a contact plug of the active layer 120. Although FIG. 1 shows that the source electrode 151 is connected to the lower electrode 140, this is only illustrative.

In the ST, a first capacitor electrode 125, a second capacitor electrode 145, and a third capacitor electrode 157 may be disposed. The first capacitor electrode 125 and the second capacitor electrode 145 may form a first capacitor, and the second capacitor electrode 145 and the third capacitor electrode 157 may form a second capacitor. The second capacitor electrode 145 may function as a common electrode of the first capacitor and the second capacitor. In addition, the first capacitor and the second capacitor may form the Cap. The ST shown in FIG. 1 is illustrative. For example, the third capacitor electrode 157 may be omitted, and only the first capacitor including the first capacitor electrode 125 and the second capacitor electrode 145 may exist.

In addition, in the ST, a first capacitor contact electrode 155 connected to the first capacitor electrode 125 through a contact plug and a second capacitor contact electrode 159 connected to the second capacitor electrode 145 through a contact plug may be disposed.

The substrate 101 may be formed of a transparent glass material having silicon oxide ($SiO_2$) as a main component. The substrate 101 is not necessarily limited thereto and may be formed of a transparent plastic material and may have a flexible characteristic. In this case, the transparent plastic material forming the substrate 101 may be any one selected from among various organic materials or a combination of a plurality of organic materials.

On the substrate 101, the light-condensing means 110, the first buffer film pattern 115, and the second buffer film pattern 117 may be disposed. The light-condensing means 110, the first buffer film pattern 115, and the second buffer film pattern 117 may be disposed in the PA, the TR, and the ST, respectively. The light-condensing means 110, the first buffer film pattern 115, and the second buffer film pattern 117 are employed in order to prevent impurity elements from permeating through the substrate 101 and to provide a flat surface on the substrate 101, and they may be formed of various materials that are capable of performing these roles. For example, each of the light-condensing means 110, the first buffer film pattern 115, and the second buffer film pattern 117 may be formed of an inorganic material, such as one of a silicon oxide, a silicon nitride, a silicon nitride oxide, an aluminum oxide, an aluminum nitride, a titanium oxide, a titanium nitride, an organic material such as one of polyimide, polyester and acryl, and a layered body of a plurality of materials selected from among the listed materials. The light-condensing means 110, the first buffer film pattern 115, and the second buffer film pattern 117 may be formed of the same material or the same combination of materials.

The light-condensing means 110 may refract light emitted by the organic layer 165 disposed thereon, the emitted light being transmitted in a direction orthogonal to the plane of the substrate 101 so that the emitted light is prevented from being dispersed to the left and right along the plane of the substrate 101. For this purpose, the light-condensing means 110 may have different thicknesses at a center part compared with an edge part thereof as shown in FIG. 1. For example, the center part of the light-condensing means 110 may be thicker than the edge part thereof. On the contrary, the center part of the light-condensing means 110 may be made thinner than the edge part thereof, depending upon the material selected for the light-condensing means.

Figure 2A:
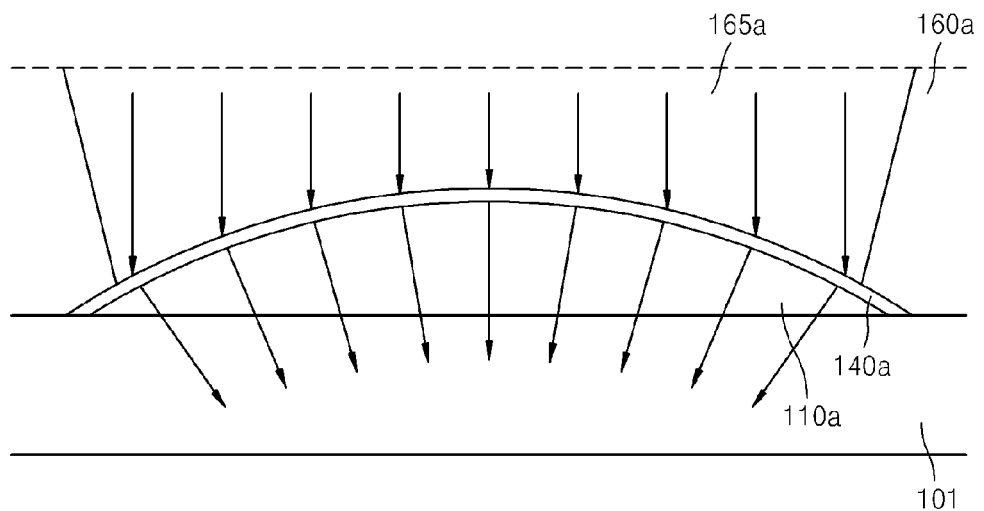
FIGS. 2A and 2B are magnified views illustrating the part labeled "A" in FIG. 1.
Figure 2B:
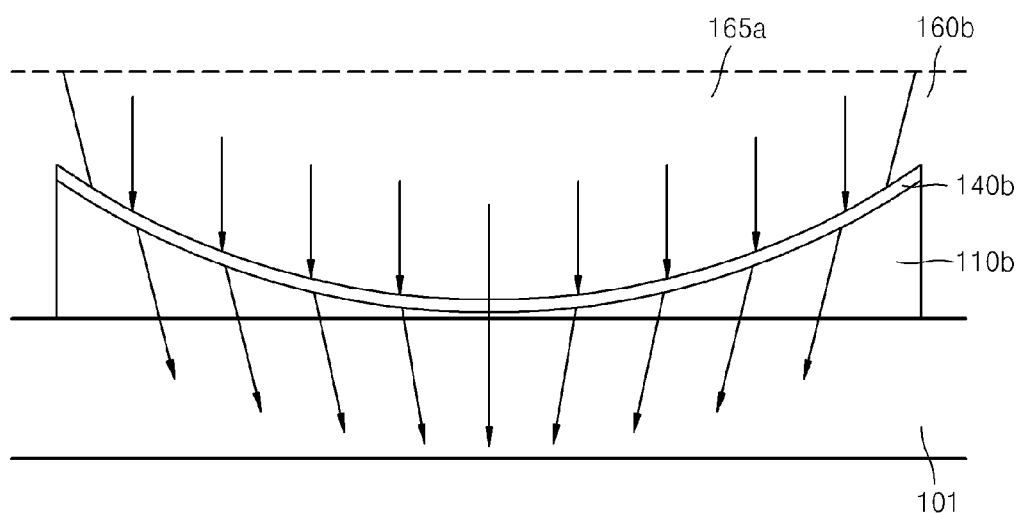

FIGS. 2A and 2B are magnified views illustrating the part labeled "A" in FIG. 1. FIG. 2A illustrates a light-condensing means 110a having a center part thicker than an edge part, and FIG. 2B illustrates a light-condensing means 110b having an edge part thicker than a center part.

Referring to FIG. 2A, the light-condensing means 110a may have the same cross-sectional shape as a convex lens, as shown in FIG. 1. In detail, the light-condensing means 110a may have a first surface directly contacting the substrate 101 and a second surface that is an opposite surface of the first surface. The second surface may be convex. A light-emitting means 165a may have a concave third surface corresponding to the second surface of the light-condensing means 110a. In this case, a refractive index of a material of the light-condensing means 110a is greater than that of the light-emitting means 165a. The light-emitting means 165a may include the organic layer 165 of FIG. 1.

As a result, light emitted by the light-emitting means 165a is refracted in a direction orthogonal to the plane of the substrate 101 by the light-condensing means 110a, which functions as a convex lens. The light emitted by the light-emitting means 165a then has a reduced intensity of light dispersed to the left and right along the plane of the substrate 101. That represents an increase of the light extraction efficiency, which is measured as a ratio of light extracted to the outside of the OLED to light generated by the light-emitting means 165a.

In FIG. 2A, a lower electrode 140a may cover the upper surface of the light-condensing means 110a and have a uniform thickness. In addition, a gate insulation layer, which may be interposed between the light-condensing means 110a and the lower electrode 140a, is omitted in FIG. 2A.

Referring to FIG. 2B, the light-condensing means 110b may have the same cross-sectional shape as a concave lens. In detail, the light-condensing means 110b may have a first surface directly contacting the substrate 101 and a second surface that is an opposite surface of the first surface. The second surface may be concave. A light-emitting means 165b may have a convex third surface corresponding to the second surface of the light-condensing means 110b. In this case, a refractive index of a material of the light-condensing means 110b is less than that of the light-emitting means 165b. The light-emitting means 165b may include the organic layer 165 of FIG. 1.

As a result, light emitted by the light-emitting means 165b is refracted in a direction orthogonal to the plane of the substrate 101 by the light-condensing means 110b functioning as a concave lens. With the light-condensing means in place, the light emitted by the light-emitting means 165b has a reduced intensity in directions to the left and right along the plane of the substrate 101. That is, light extraction efficiency, which is a ratio of light extracted to the outside of the OLED to light generated by the light-emitting means 165b, is increased with the light-condensing means in place.

In FIG. 2B, a lower electrode 140b may cover the upper surface of the light-condensing means 110b and have a uniform thickness. In addition, a gate insulation layer, which may be interposed between the light-condensing means 110b and the lower electrode 140b, is omitted in FIG. 2B.

Referring back to FIG. 1, the first buffer film pattern 115 and the second buffer film pattern 117 may be disposed below the active layer 120 and the first capacitor electrode 125, respectively. As described below in detail, a buffer film may be patterned with the first buffer film pattern 115 and the second buffer film pattern 117 because, when a semiconductor material layer is patterned to form the active layer 120 and the first capacitor electrode 125, if a semiconductor material is not fully removed from the buffer film in the PA, the semiconductor material that is not fully removed may be shown as a dark point in the PA during operation of the OLED. In order to prevent the semiconductor material from remaining on the buffer film of the PA, at least a portion of the buffer film of the PA may be removed. To do this, the buffer film may be patterned with the first buffer film pattern 115 and the second buffer film pattern 117 by etching to remove excess buffer film material.

The semiconductor material layer may be composed of a silicon material, such as non-crystalline silicon or poly-silicon. Alternatively, the semiconductor material layer may be an oxide semiconductor.

The active layer 120 may be disposed on the first buffer film pattern 115, and the first capacitor electrode 125 may be disposed on the second buffer film pattern 117. The active layer 120 and the first capacitor electrode 125 may be formed of the same material or the same combination of materials. As described above, the active layer 120 and the first capacitor electrode 125 may include a semiconductor material, for example, a silicon material or an oxide semi-conductor. A portion of the active layer 120 that is located below the gate electrode 147 may function as a channel region, and the other portion of the active layer 120 may have conductivity by being doped with impurity ions. The active layer 120 doped with impurity ions may be named as the source region and the drain region. Likewise, the first capacitor electrode 125 may also have conductivity by being doped with impurity ions.

A gate insulation film 130 may be disposed to cover the light-condensing means 110, the active layer 120 on the first buffer film pattern 115, and the first capacitor electrode 125 on the second buffer film pattern 117. The gate insulation film 130 may be formed of one of an oxide, a nitride, an oxynitride, and a combination of them. For example, the gate insulation film 130 may have a layered structure of a silicon oxide at a lower part thereof, a silicon nitride, and a silicon oxide at an upper part thereof. Since a silicon nitride has a greater dielectric constant than a silicon oxide, a capacitance of the first capacitor including the first capacitor electrode 125 and the second capacitor electrode 145, which uses the gate insulation film 130 as a capacitor dielectric, may increase relative to the capacitance that would be expected for the case in which gate insulation film 130 consists only of silicon oxide. The gate insulation film 130 may also be disposed on the light-condensing means 110 and have a uniform thickness.

The lower electrode 140 and the second capacitor electrode 145 may be disposed on the gate insulation film 130. The lower electrode 140 and the second capacitor electrode 145 may be formed of the same conductive material, for example, a transmissive conductive material, such as one of indium tin oxide (ITO), indium zinc oxide (IZO), zinc oxide (ZnO), indium oxide ($In_2O_3$), indium gallium oxide (IGO) and aluminum zinc oxide (AZO).

A lower electrode pad 142 may be disposed on a portion of the lower electrode 140. In addition, the gate electrode 147 may be disposed on the gate insulation film 130 that is on the active layer 120. The lower electrode pad 142 and the gate electrode 147 may be formed of the same conductive material, for example, one of a metal and an alloy of metals, such as one of molybdenum (Mo), a molybdenum tungsten alloy (MoW), and an aluminum (Al)-group alloy, but are not limited thereto. In addition, the lower electrode pad 142 and the gate electrode 147 may have a layered structure of Mo/Al/Mo.

A conductive layer formed of the same material as that of the lower electrode 140 may be inserted between the gate insulation film 130 and the gate electrode 147. In addition, a conductive layer formed of the same material as that of the gate electrode 147 may be directly layered on the second capacitor electrode 145. In addition, the lower electrode pad 142 may be omitted.

An inter-layer insulation film 150 may be disposed to cover the gate electrode 147 and the second capacitor electrode 145 while exposing the lower electrode 140. The inter-layer insulation film 150 may be formed of various insulation materials, for example, inorganic materials such as an oxide, a nitride, and a nitrogen oxide. As shown in FIG. 1, the inter-layer insulation film 150 may cover the lower electrode pad 142. According to another embodiment, the inter-layer insulation film 150 may leave a portion of the lower electrode pad 142 exposed.

The inter-layer insulation film 150 may include a contact hole exposing the lower electrode pad 142. In addition, the inter-layer insulation film 150 may include a contact hole exposing a portion of the second capacitor electrode 145. In addition, the gate insulation film 130 and the inter-layer insulation film 150 may include contact holes exposing the source region and the drain region of the active layer 120 and a portion of the first capacitor electrode 125.

Although FIG. 1 shows that the inter-layer insulation film 150 covers the second capacitor electrode 145, according to another embodiment in which only one capacitor is disposed in the ST, the inter-layer insulation film 150 may not cover the second capacitor electrode 145 but instead leave it exposed.

The contact holes of the gate insulation film 130 and the inter-layer insulation film 150 and the contact holes of the inter-layer insulation film 150 may be filled by a conductive material. The source electrode 151 may be disposed on the inter-layer insulation film 150 and connect the source region of the active layer 120 to the lower electrode pad 142. The drain electrode 153 may also be disposed on the inter-layer insulation film 150 and connect to the drain region of the active layer 120. The first capacitor contact electrode 155 and the second capacitor contact electrode 159 may also be disposed on the inter-layer insulation film 150 and connect to the first capacitor electrode 125 and the second capacitor electrode 145 through the contact plugs, respectively.

The third capacitor electrode 157 may be disposed on the inter-layer insulation film 150 that is on the second capacitor electrode 145. As described above, the second capacitor electrode 145 and the third capacitor electrode 157 may form the second capacitor.

The source electrode 151, the drain electrode 153, the first capacitor contact electrode 155, the third capacitor electrode 157, and the second capacitor contact electrode 159 may be formed of the same conductive material, for example, a metal, such as one of gold (Au), palladium (Pd), platinum (Pt), nickel (Ni), rhodium (Rh), ruthenium (Ru), iridium (Ir), osmium (Os), aluminum (Al), molybdenum (Mo), neodymium (Nd), tungsten (W), and an alloy of two or more of these metals.

A pixel definition film 160 may be disposed to cover the source electrode 151, the drain electrode 153, the first capacitor contact electrode 155, the third capacitor electrode 157, and the second capacitor contact electrode 159, all of which are on the inter-layer insulation film 150, while leaving a portion of the lower electrode 140 exposed. The pixel definition film 160 defines a pixel in the PA.

The organic layer 165 may be disposed on the lower electrode 140, most of which was left exposed through an opening in the surrounding pixel definition film 160. The organic layer 165 may be formed of a low or high molecular weight organic film. When the organic layer 165 is formed of a low molecular weight organic film, the organic layer 165 may include a hole injection layer (HIL), a hole transport layer (HTL), an emissive layer (EML), an electron transport layer (ETL), an electron injection layer (EIL), and so forth.

The HIL may be formed of a material selected from a phthalocyanine (Pc) compound, such as copper phthalocyanine (CuPc), and starburst-type amines, such as tris(4-carbazoyl-9ylphenyl)amine (TCTA), 4,4',4"-tris(N-3-methylphenyl-N-phenylamino)triphenylamine (m-MTDATA), 1,3,5-tris(4-(3-methyldiphenylamino)phenyl)benzene (m-MTDAPB), and so forth. The HTL may be formed of N,N'-bis(3-methylphenyl)-N,N'-diphenyl-[1,1-biphenyl]-4,4'-diamine (TPD), N,N'-Di(naphthalene-1-yl)-N,N'-diphenyl-benzidine (α-NPD), and so forth. The EIL may be formed using materials such as lithium fluoride (LiF), sodium chloride (NaCl), cesium fluoride (CsF), lithium oxide ($Li_2O$), barium oxide (BaO), lithium quinolate (Liq), and so forth. The ETL may be formed using tris-(8-hydroxyquinolinato)aluminum ($Alq_3$). The organic layer 165 may include a host material and a dopant material.

The upper electrode 170 may be disposed on the organic layer 165. The upper electrode 170 may be formed of a metal, such as one of silver (Ag), magnesium (Mg), Al, Pt, Pd, Au, Ni, Nd, Ir, chromium (Cr), Li and calcium (Ca). In addition, the upper electrode 170 may be formed of a transmissive conductive material, such as one of indium tin oxide (ITO), indium zinc oxide (IZO), zinc oxide (ZnO) and indium oxide ($In_2O_3$), in order to be able to transmit light.

A seal holding member 180 may be disposed on the upper electrode 170. The seal holding member 180 may be formed using an organic or inorganic material.

In the OLED device according to the current embodiment, the light-condensing means 110 may be interposed between the organic layer 165 and the substrate 101. The light-condensing means 110 may be formed of the same material as the first buffer film pattern 115 and the second buffer film pattern 117 and may have the same cross-sectional shape as a convex or concave lens. It should be understood that the convex lens indicates not only a lens having both convex surfaces but also a lens having one flat surface and another surface that is convex. In addition, it should be understood that the concave lens indicates not only a lens having both concave surfaces but also a lens having one flat surface and another surface that is concave. The light-condensing means 110 refracts light generated by the organic layer 165 in a direction orthogonal to the plane of the substrate 101. As a result, the light generated by the organic layer 165 is extracted to the outside through the substrate 101 without being dispersed to the left and right along the plane of the substrate 101. That is, light extraction efficiency increases relative to that of a comparable OLED that lacks light-condensing means 110.

FIGS. 3 through 12 are cross-sectional views schematically illustrating a method of manufacturing an OLED device sequentially according to an embodiment of the present invention.

Hereinafter, a method of manufacturing the OLED device 100 of FIG. 1 is schematically described. The method described with reference to FIGS. 3 through 12 is an embodiment of the invention and is a method of manufacturing the OLED device 100 of FIG. 1.

Figure 3:
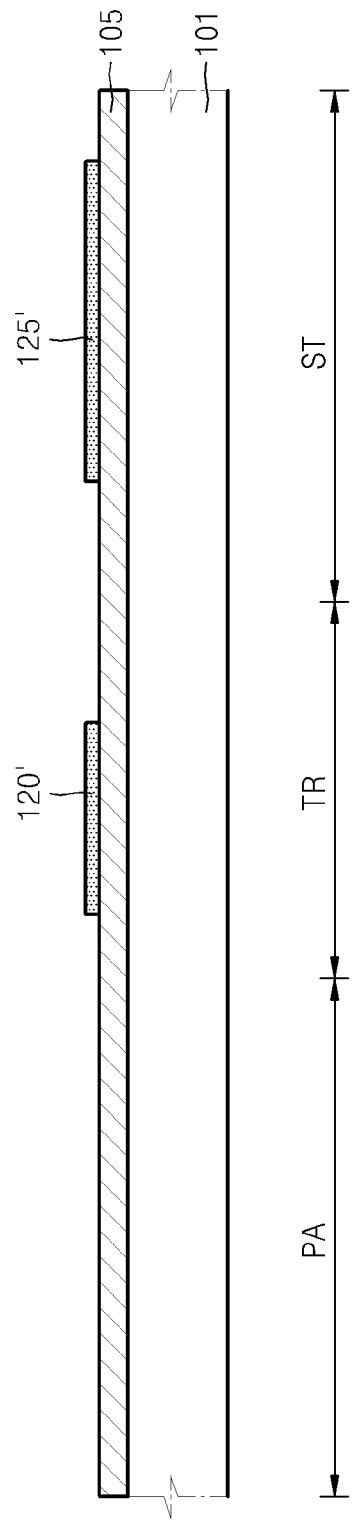

Referring to FIG. 3, a buffer film 105 may be formed on the upper surface of the substrate 101. In detail, the substrate 101 may be formed of any of various materials, such as a transparent glass material of which a main component is one of a silicon oxide ($SiO_2$), a transparent plastic material and a metal material.

The buffer film 105, such as a barrier film and/or a blocking film, may be disposed on the upper surface of the substrate 101 to prevent diffusion of impurity ions thereon, to prevent permeation of moisture or external air, and to planarize the upper surface of the substrate 101. The buffer film 105 may be formed by various deposition methods, such as one of a plasma enhanced chemical vapor deposition (PECVD) method, an atmospheric pressure CVD (APCVD) method, and a low pressure CVD (LPCVD) method, using an inorganic insulation material such as a silicon oxide, a silicon nitride, and/or a silicon oxynitride.

On the buffer film 105, a first semiconductor pattern 120', which is going to function as the active layer 120, and a second semiconductor pattern 125', which is going to function as the first capacitor electrode 125, may be formed. In detail, a polysilicon layer (not shown) may be formed by performing deposition of a semiconductor material layer (not shown), e.g., a non-crystalline silicon layer, on the buffer film 105 and crystallizing the non-crystalline silicon. The non-crystalline silicon may be crystallized by various methods, such as a rapid thermal annealing (RTA) method, a solid phase crystallization (SPC) method, an excimer laser annealing (ELA) method, a metal induced crystallization (MIC) method, a metal induced lateral crystallization (MILC) method, and a sequential lateral solidification (SLS) method. The formed polysilicon layer may be patterned to the first semiconductor pattern 120' and the second semiconductor pattern 125' by a photolithography process using a first mask (not shown).

In the latter embodiment of the invention, although the first semiconductor pattern 120' and the second semiconductor pattern 125' are separately formed, the first semiconductor pattern 120' and the second semiconductor pattern 125' may be formed as one body. According to another embodiment of the invention, polysilicon patterns may be formed by first patterning and then crystallizing the non-crystalline silicon layer.

Referring to FIG. 4, first to third photoresist patterns 127a, 127b, and 127c may be disposed on the buffer film 105. In detail, the first photoresist pattern 127a may form the light-condensing means 110 of FIG. 1, and the second and third photoresist patterns 127b and 127c may form the first and second buffer film patterns 115 and 117 of FIG. 1, respectively.

For this, a photoresist film (not shown) may be formed on the buffer film 105 on which the first semiconductor pattern 120' and the second semiconductor pattern 125' are formed. A material of the photoresist film may include a material reacting to light as a photosensitive polymer. The photoresist material may include a solvent, a hydrocarbon polymer, and a photoactive compound (PAC). The photoresist materials may be largely classified into two types, a negative type in which the part exposed to light becomes solid and insoluble in the photoresist developer while the other part remains soluble in the photoresist developer, and a positive type in which the part exposed to light becomes soluble in the photoresist developer.

After coating the photoresist film, the photoresist film may be exposed to light by using a half-tone mask 129. The photoresist film illustrated in FIG. 4 is a positive photoresist film. However, the photoresist film may be a negative photoresist film, and, in this case, the regions of the half-tone mask 129 may be inverted with respect to their transmittance of light.

The half-tone mask 129 may include a plurality of regions, namely first to fifth regions 129a through 129e, having different light transmittance properties. For example, the half-tone mask 129 may include the first region 129a blocking 100% of light and the fifth region 129e transmitting 100% of light. The half-tone mask 129 may include the second, third, and fourth regions 129b, 129c, and 129d blocking a portion of incident light and transmitting the remaining portion. For example, the second region 129b may block 75% of incident light, the third region 129c may block 50% of incident light, and the fourth region may block 25% of incident light.

The half-tone mask 129 of FIG. 4 is illustrative. Other masks capable of partially exposing the photoresist film to light may be used. In addition, the half-tone mask 129 may be divided into a different number of regions, and the values described above in relation to the light transmittance are illustrative. The half-tone mask 129 may be called a second mask.

The photoresist film may be partially exposed to the light, which has transmitted through the half-tone mask 129. The partially light-exposed photoresist film may be partially removed through a developing process. As conceptually shown in FIG. 4, in the first region 129a, the photoresist film is not exposed to light because the light is fully blocked by the first region 129a of the half-tone mask 129, and, accordingly, the photoresist film corresponding to the first region 129a is not removed in the case of the use of a positive-type photoresist material. In addition, in the fifth region 129e, the photoresist film is fully exposed to light because light fully transmits through the fifth region 129e, and, accordingly, the photoresist film corresponding to the fifth region 129e may be fully removed if a positive-type photoresist material is used. The second and third photoresist patterns 127b and 127c may be formed by partial transmittance of light through the corresponding regions of the mask.

In addition, again for the case of a positive-type photoresist material, the photoresist film corresponding to the second, third, and fourth regions 129b, 129c, and 129d may partially remain in correspondence with light-blocking ratios of the second, third, and fourth regions 129b, 129c, and 129d of the mask. The area of the photoresist film corresponding to the second region 129b of the mask having a high blocking ratio may remain to a greater extent unchanged in comparison with the area of the photoresist film corresponding to the fourth region 129d of the mask, which has a low blocking ratio. As a result, the first photoresist pattern 127a, which is shown in FIG. 4, may be formed. As shown in FIG. 4, the first photoresist pattern 127a may have a shape of which a center part is thicker than an edge part.

However, in order to manufacture the structure of the embodiment illustrated in FIG. 2B, a first photoresist pattern may have a shape of which an edge part is thicker than a center part.

Referring to FIG. 5, the light-condensing means 110 and the first and second buffer film patterns 115 and 117 may be disposed on the substrate 101. For this, the buffer film 105 may be etched using an etching mask comprising the first to third photoresist patterns 127a, 127b, and 127c.

Over-etching may be performed to form the first photoresist pattern 127a from the buffer film 105. The exposed buffer film 105 and the first photoresist pattern 127a may then be removed together by the over-etching. As a result, as the first photoresist pattern 127a is gradually removed from the edge part, which is thinner than the center part, the portion of buffer film 105 that is disposed below the first photoresist pattern 127a may take on the shape of a convex lens of which a center part is thicker than an edge part, as shown in FIG. 5.

The first to third photoresist patterns 127a, 127b, and 127c, which have not at this point in the procedure been fully removed by etching, may be fully removed by an ashing and stripping process. The ashing and stripping process, which may be named as a stripping process, is a process of removing photoresist patterns remaining in a photolithography process. For example, the remaining photoresist patterns may be removed using an oxygen plasma in an ashing process. As another example, the remaining photoresist patterns may be removed using sulfuric acid ($H_2SO_4$) and hydrogen peroxide ($H_2O_2$) in a stripping process.

As described above with reference to FIG. 3, the non-crystalline silicon layer or the poly-silicon layer is patterned through a photolithography process and an etching process, and the pattern remains in only the TR and the ST. However, even though the photolithography process and the etching process have been performed, the non-crystalline silicon layer or the poly-silicon layer may not be fully removed in the PA. The non-crystalline silicon layer or the poly-silicon layer, which has not been fully removed, may be shown as a dark point during operation of the OLED. To address this problem, at least a portion of the buffer film 105 of the PA may be removed. As a result, the non-crystalline silicon layer or the poly-silicon layer may be fully removed from the PA.

Referring to FIG. 6, the gate insulation film 130 may be disposed on the light-condensing means 110 that is on the substrate 101, the first semiconductor pattern 120' may be disposed on the first buffer film pattern 115, and the second semiconductor pattern 125' may be disposed on the second buffer film pattern 117.

The gate insulation film 130 may be formed of one of an oxide, a nitride, an oxynitride, and a combination thereof. For example, the gate insulation film 130 may have a layered structure including, sequentially layered, a silicon oxide at a lower part thereof, a silicon nitride disposed on the silicon nitride, and a silicon oxide at an upper part thereof. The gate insulation film 130 may be deposited by one of the PECVD method, the APCVD method, and the LPCVD method.

The gate insulation film 130 may be interposed between the active layer 120 and the gate electrode 147 of the TFT to function as a gate insulation film of the TFT. In addition, the gate insulation film 130 may be interposed between the first capacitor electrode 125 and the second capacitor electrode 145 to function as a dielectric layer of the first capacitor. As described above, to increase a capacitance of the first capacitor, the gate insulation film 130 may include an insulation material having a high dielectric constant. For example, the gate insulation film 130 may have a structure in which a silicon nitride having a higher dielectric constant than a silicon oxide is interposed between silicon oxides.

The gate insulation film 130 may also be disposed on the light-condensing means 110 with a uniform thickness. When the gate insulation film 130 is layered with a uniform thickness on the light-condensing means 110 having a curvature, light that is incident to the gate insulation film 130 at a predetermined angle leaves the gate insulation film 130 at the predetermined angle. The gate insulation film 130 may have essentially no effect on the refraction path of the light.

Referring to FIG. 7, the lower electrode 140 may be disposed on the gate insulation film 130 that is on the light-condensing means 110, and the second capacitor electrode 145 may be disposed on the gate insulation film 130 that is on the second semiconductor pattern 125'.

In detail, a first conductive layer (not shown) may be layered on the gate insulation film 130. The first conductive layer may include one or more selected from among transparent conductive materials, such as ITO, IZO, ZnO, and $In_2O_3$. The first conductive layer may be patterned to the lower electrode 140 and the second capacitor electrode 145 through a photolithography process and an etching process using a third mask (not shown).

Although FIG. 7 does not show a pattern of the first conductive layer disposed on the gate insulation film 130, which is on the first semiconductor pattern 120', the pattern of the first conductive layer may if necessary be disposed on the gate insulation film 130, which is on the first semiconductor pattern 120', to function as a lower conductive layer in contact with gate electrode 147.

Referring to FIG. 8, a conductive pattern 141 and the lower electrode pad 142 are disposed on the lower electrode 140, and the gate electrode 147 is disposed on the gate insulation film 130 that is on the active layer 120. In addition, the first and second semiconductor patterns 120' and 125' become the active layer 120 and the first capacitor electrode 125.

A second conductive layer (not shown) may be layered on the gate insulation film 130 on which the lower electrode 140 and the second capacitor electrode 145 are disposed. The second conductive layer may include one or more selected from among Ag, Mg, Al, Pt, Pd, Au, Ni, Nd, Ir, Cr, Li, Ca, Mo, Ti, W, MoW, and Al/Cu. The second conductive layer may be formed in a 3-layer structure of Mo—Al—Mo.

The second conductive layer may be patterned to the conductive pattern 141, the lower electrode pad 142, and the gate electrode 147 through a photolithography process and an etching process. The gate electrode 147 may be disposed on the center of the first semiconductor pattern 120'.

By doping the first semiconductor pattern 120' with n- or p-type impurities using a self-alignment mask, a channel region may be formed in the center part of the first semiconductor pattern 120', and a source region and a drain region may be formed in the edge parts of the first semiconductor pattern 120'. The first semiconductor pattern 120' doped with impurities may be named as the active layer 120. The impurities may be boric (B) ions or phosphorous (P) ions.

In addition, due to doping with the n- or p-type impurities, the second semiconductor pattern 125' also has conductivity and becomes the first capacitor electrode 125.

The conductive pattern 141 disposed on the lower electrode 140 may prevent damage to the surface of the lower electrode 140 due to doping with the ion impurities. The conductive pattern 141 may be omitted without being generated in a photolithography process and an etching process using a fourth mask (not shown). In addition, although FIG. 8 shows that the conductive pattern 141 is separated from the lower electrode pad 142, the conductive pattern 141 and the lower electrode pad 142 may be formed as one body.

Figure 9:
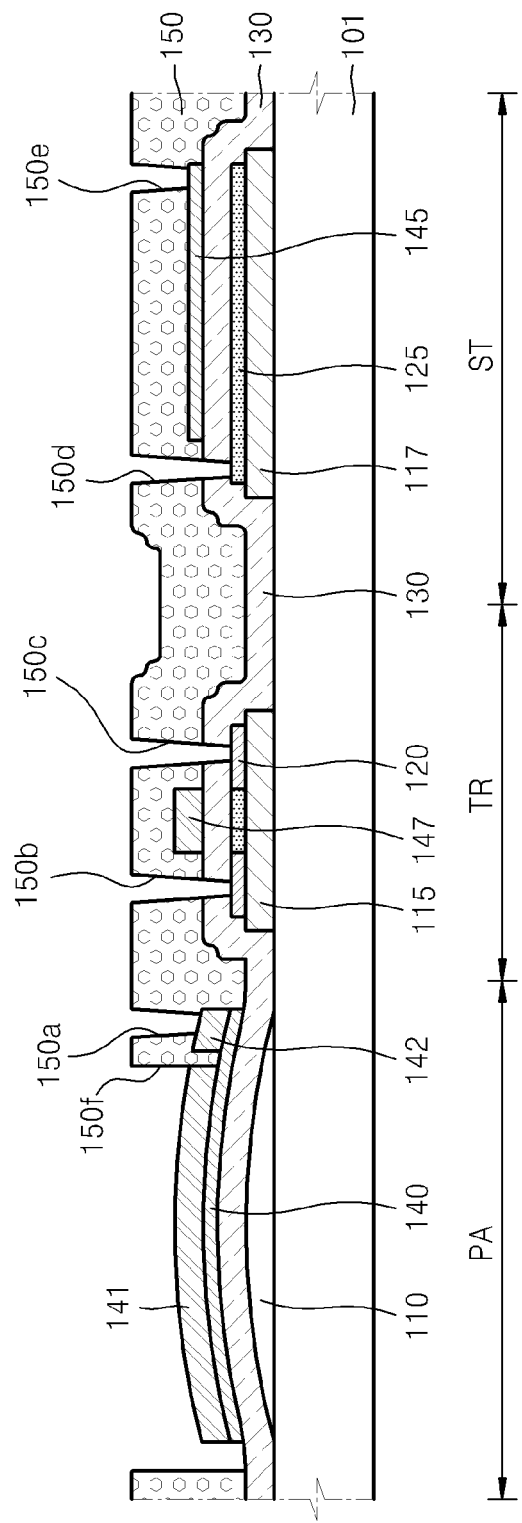

Referring to FIG. 9, the inter-layer insulation film 150 is disposed on the structure shown in FIG. 8. The inter-layer insulation film 150 may include a first opening 150a for exposing at least a portion of the upper surface of the lower electrode pad 142. In addition, the inter-layer insulation film 150 may include a fifth opening 150e for exposing at least a portion of the upper surface of the second capacitor electrode 145. The inter-layer insulation film 150 and the gate insulation film 130 may include a second opening 150b for exposing at least a portion of the source region of the active layer 120, a third opening 150c for exposing at least a portion of the drain region of the active layer 120, and a fourth opening 150d for exposing at least a portion of the upper surface of the first capacitor electrode 125. In addition, the inter-layer insulation film may include a sixth opening 150f for exposing the conductive pattern 141.

In detail, a first insulation material layer (not shown) may be layered on the structure shown in FIG. 8. The first insulation material layer may be formed of the same inorganic insulation material as the gate insulation film 130. For example, the first insulation material layer may be formed of a silicon oxide, a silicon nitride, and/or a silicon nitride oxide. In addition, the first insulation material layer may be formed of one or more organic insulation materials selected from a group including polyimide, polyamide, acryl resin, benzocyclobutene, and phenol resin by using a method such as spin coating. The first insulation material layer may have a structure in which an organic insulation material and an inorganic insulation material are alternately layered.

The first insulation material layer may be patterned to the inter-layer insulation film 150 including the first to sixth openings 150a through 150f based on a photolithography process and an etching process using a fifth mask (not shown).

The inter-layer insulation film 150 on the second capacitor electrode 145 may function as a dielectric layer of the second capacitor between the third capacitor electrode 157, which is generated by a succeeding process, and the second capacitor electrode 145. Thus, a thickness of the inter-layer insulation film 150 influences a capacitance of the second capacitor, which includes the second capacitor electrode 145 and the third capacitor electrode 157. In addition, a dielectric constant of a material of the inter-layer insulation film 150 also influences a capacitance of the second capacitor. A thickness and a material of the inter-layer insulation film 150 may be determined to meet a target capacitance of the second capacitor.

Figure 10:
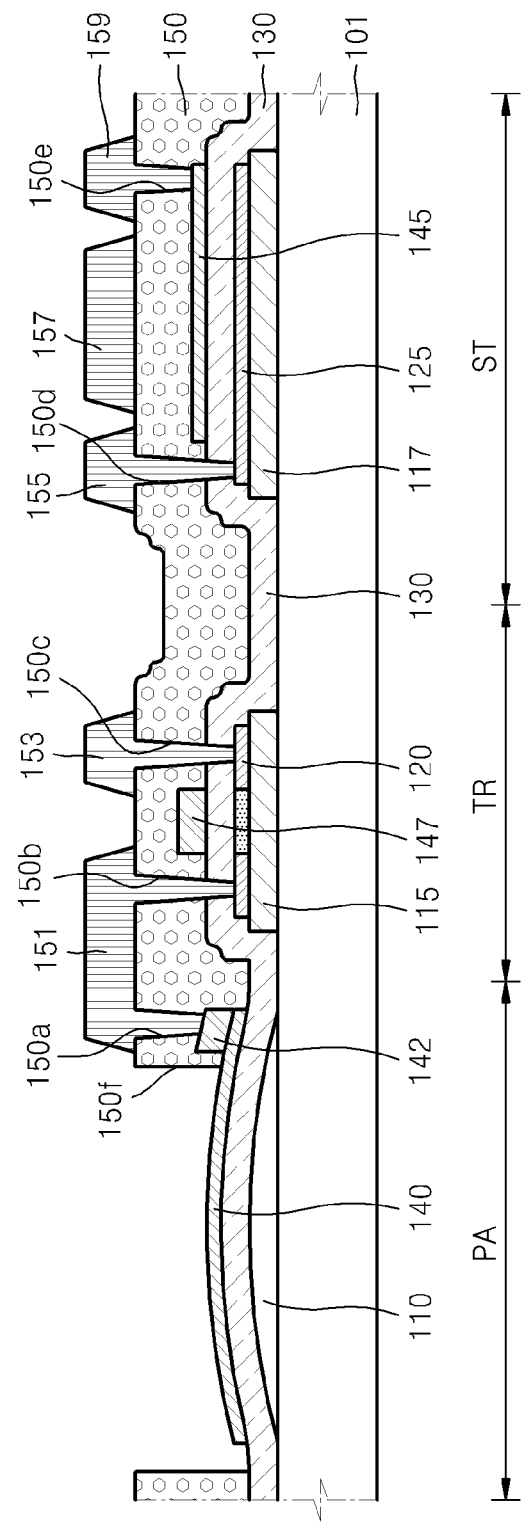

Referring to FIG. 10, the source electrode 151, the drain electrode 153, the first capacitor contact electrode 155, and the second capacitor contact electrode 159 filling up the first to fifth openings 150a through 150e in the inter-layer insulation film 150 are disposed on the inter-layer insulation film 150, and the third capacitor electrode 157 is disposed on the inter-layer insulation film 150 that is on the second capacitor electrode 145. The source electrode 151 fills up the first and second openings 150a and 150b to electrically connect the lower electric pad 142 to the source region of the active layer 120. The drain electrode 153 electrically connects to the drain region of the active layer 120. In addition, the first and second capacitor contact electrodes 155 and 159 connect to the first and second capacitor electrodes 125 and 145, respectively. In addition, the conductive pattern 141 layered on the lower electrode 140 is removed, and at least a portion of the upper surface of the lower electrode 140 is exposed to the outside.

In detail, a third conductive layer (not shown) may be deposited on the entire surface of the substrate 101 to cover the inter-layer insulation film 150. The third conductive layer may include one or more materials selected from among Ag, Mg, Al, Pt, Pd, Au, Ni, Nd, Ir, Cr, Li, Ca, Mo, Ti, W, MoW, and Al/Cu. The third conductive layer may be formed in a 3-layer structure of Mo—Al—Mo. The third conductive layer should be deposited with sufficient thickness to fill the first to fifth openings 150a to 150e and should have good step coverage.

The third conductive layer may be patterned to the source electrode 151, the drain electrode 153, the first capacitor contact electrode 155, the third capacitor electrode 157, and the second capacitor contact electrode 159 through a photolithography process and an etching process using a sixth mask (not shown). In the photolithography process and the etching process using the sixth mask, the conductive pattern 141 may be etched and removed together with the third conductive layer.

According to another embodiment, the conductive pattern 141 may be removed in a separate etching process using the inter-layer insulation film 150, the source electrode 151, the drain electrode 153, the first capacitor contact electrode 155, the third capacitor electrode 157, and the second capacitor contact electrode 159 as an etching mask. In this case, a material of the conductive pattern 141 and a material of the third conductive layer may have an etching selection ratio, the two materials being etched at different rates in the separate etching process.

As described above, the third capacitor electrode 157, which is disposed on the inter-layer insulation film 150, which is on the second capacitor electrode 145, may form the second capacitor together with the second capacitor electrode 145.

Figure 11:
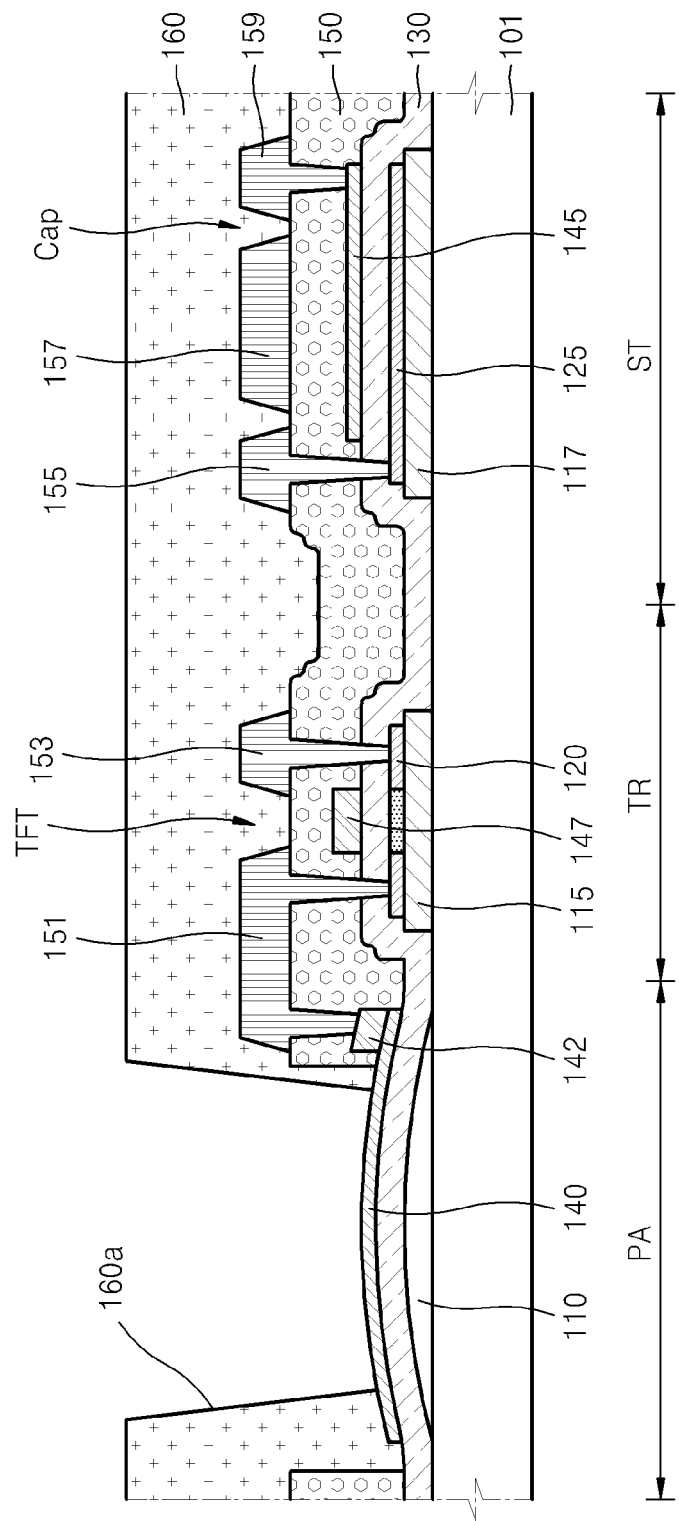

Referring to FIG. 11, the pixel definition film 160 may be disposed to cover the inter-layer insulation film 150, the source electrode 151, the drain electrode 153, the first capacitor contact electrode 155, the third capacitor electrode 157, and the second capacitor contact electrode 159 and to expose the lower electrode 140.

In detail, a second insulation material layer (not shown) may be layered on the structure shown in FIG. 10. The second insulation material layer may be formed of one or more organic insulation materials selected from a group including polyimide, polyamide, acryl resin, benzocyclobutene, and phenol resin by using a method such as spin coating. The second insulation material layer may be formed of not only the organic insulation materials but also an inorganic insulation material selected from among a silicon oxide, a silicon nitride, an aluminum oxide, a copper oxide, a terbium oxide, an yttrium oxide, a niobium oxide, and a praseodymium oxide. In addition, the second insulation material layer may have a multi-layer structure in which an organic insulation material and an inorganic insulation material are alternately layered.

The second insulation material layer may be patterned to leave the upper surface of the lower electrode 140 exposed using a photolithography process and an etching process using a seventh mask (not shown). As a result, the pixel definition film 160 may be formed. The pixel definition film 160 may include an opening 160a, which exposes the center part of the upper surface of the lower electrode 140 and defines a pixel.

Figure 12:
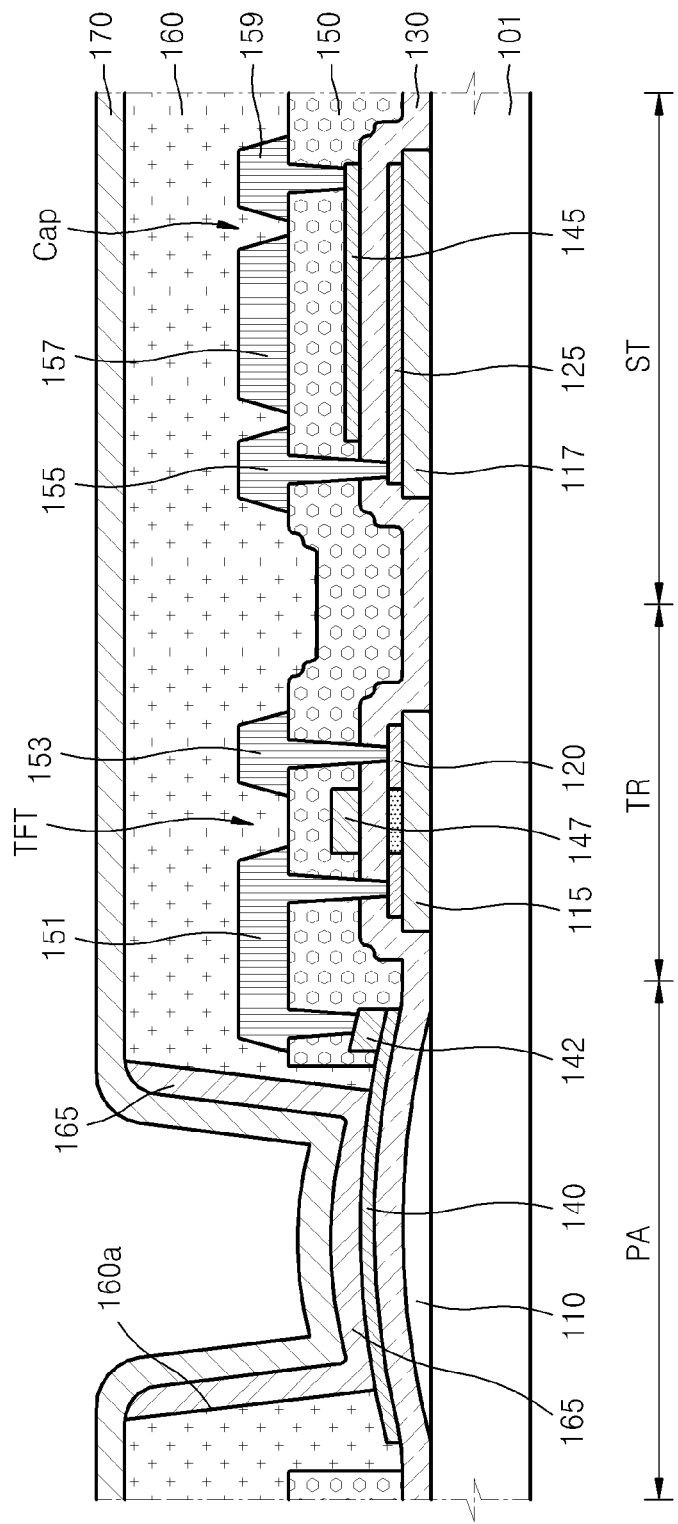

Referring to FIG. 12, the organic layer 165 is formed in the opening 160a over and in contact with the exposed lower electrode 140, and the upper electrode 170 is formed on the organic layer 165 and the pixel definition film 160.

The organic layer 165 may be formed by layering one or more functional layers such as the EML, the HTL, the HIL, the ETL, and the EIL.

The organic layer 165 may be formed of a low or high-molecular weight organic material.

When the organic layer 165 is formed of a low-molecular weight organic material, the organic layer 165 may include the EML, the HTL and the HIL, which are layered sequentially from a position adjacent to the EML toward the lower electrode 140, and the ETL and the EIL, which are layered sequentially from a position adjacent to the EML toward the upper electrode 170. Additionally, if necessary, some or all of these layers may themselves be layered. Such layering within layers may be accomplished using organic materials selected from CuPc, N,N'-Di(naphthalene-1-yl)-N,N'-diphenyl-benzidine (α-NPD), Alq$_3$, and so forth.

When the organic layer 165 is formed of a high-molecular weight organic material, the organic layer 165 may include the HTL as the only layer between the EML and the lower electrode 140. The HTL may be formed on the lower electrode 140 by one of inkjet printing and spin coating, using poly(3,4-ethylenedioxythiophene) (PEDOT), polyaniline (PANI), or the like. In this case, available organic materials include high-molecular weight organic materials, such as a poly-phenylenevinylene (PPV) group and a polyfluorene group, and a color pattern may be formed by a method, such as one of inkjet printing, spin coating and a typical method, such as a thermal transfer method using a laser.

The upper electrode 170 may be deposited on the entire surface of the substrate 101 and formed as a common electrode. The lower electrode 140 may be used as an anode electrode, and the upper electrode 170 may be used as a cathode electrode. Of course, the polarities of the lower electrode 140 and the upper electrode 170 may be opposite.

The OLED device 100 may be a bottom emission type in which an image is radiated in the direction of the substrate 101. In this case, the lower electrode 140 may be a transparent electrode, and the upper electrode 170 may be a reflective electrode. In this case, the reflective electrode may be formed by depositing in a thin layer a metal having a by work function, e.g., one of Ag, Mg, Al, Pt, Pd, Au, Ni, Nd, Ir, Cr, Li, Ca, LiF/Ca, LiF/Al, and a compound thereof.

Thereafter, as shown in FIG. 1, the seal holding member 180 may be disposed on the substrate 101. The seal holding member 180 may be attached to the substrate 101 using a sealing member (not shown).

Although the OLED device 100 has been described as an example in the embodiments of the invention described above, the present invention is not limited thereto and is applicable to various display devices including liquid crystal display devices.

In addition, although only one TFT and one capacitor are shown in the drawings for describing the embodiments of the present invention, this is only for convenience and clarity of description. The present invention is not limited thereto and may include a plurality of TFT's and a plurality of capacitors.

According to an OLED device and a method of manufacturing the same according to the present invention, light, which has been generated by an organic light-emitting layer and has passed through an anode electrode, is oriented towards a direction orthogonal to the plane of a substrate of the OLED by a light-condensing means, thereby improving light extraction efficiency.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic light-emitting display (OLED) device comprising:
   a substrate of which a pixel region and a circuit region are defined;
   a buffer layer including a light-condensing means on the pixel region of the substrate and a first buffer film pattern on the circuit region of the substrate;
   an active layer on the first buffer film pattern;
   a gate insulation film on the light-condensing means and the active layer;
   a gate electrode on the active layer;

a lower electrode on the light-condensing means;
an organic layer, on the lower electrode; and
an upper electrode on the organic layer, wherein
the light-condensing means and the first buffer film pattern are formed of the same material and are disposed on the same plane, and
the gate insulation film is interposed between the light-condensing means and the lower electrode in the pixel region and between the active layer and the gate electrode in the circuit region.

2. The OLED device of claim 1, wherein the organic layer comprises an organic light-emitting layer.

3. The OLED device of claim 1, further comprises a thin-film transistor array on the circuit region of the substrate, wherein
the thin-film transistor array comprises:
the active layer including a channel region; and
the gate electrode on the channel region of the active layer.

4. The OLED device of claim 1, wherein the first buffer film pattern is physically separated from the light-condensing means.

5. The OLED device of claim 1, the substrate comprising a storage region distinguished from the pixel region, and the OLED device further comprises:
a first capacitor electrode disposed in the storage region; and
a second capacitor electrode disposed on the first capacitor electrode,
the gate insulation film being interposed between the first capacitor electrode and the second capacitor electrode in the storage region.

6. The OLED device of claim 5, further comprising a second buffer film pattern, which is interposed between the substrate and the first capacitor electrode and is disposed on the same plane with but is physically separated from the light-condensing means.

7. The OLED device of claim 5, further comprising a third capacitor electrode disposed on the second capacitor electrode,
the first capacitor electrode and the second capacitor electrode forming a first capacitor,
the second capacitor electrode and the third capacitor electrode forming a second capacitor, and
the second capacitor electrode being a common electrode of the first capacitor and the second capacitor.

8. The OLED device of claim 1, the light-condensing means being formed directly on the substrate.

9. The OLED device of claim 1, the light-condensing means having a cross-sectional shape of a convex lens of which a center part is thicker than an edge part.

10. The OLED device of claim 9, a refractive index of a material of the light-condensing means being greater than that of the organic layer.

11. The OLED device of claim 1, the light-condensing means having a cross-sectional shape of a concave lens of which an edge part is thicker than a center part.

12. The OLED device of claim 11, a refractive index of a material of the light-condensing means being less than that of the organic layer.

13. The OLED device of claim 1, the light-condensing means being formed using a half-tone mask.

14. The OLED device of claim 1, the substrate being substantially planar, the light emitted by the organic layer being converged on a focal point by the light-condensing means.

* * * * *